(12) United States Patent
Schanin et al.

(10) Patent No.: US 8,350,416 B2
(45) Date of Patent: Jan. 8, 2013

(54) TRANSITION-RATE CONTROL FOR PHASE-CONTROLLED AC POWER DELIVERY SYSTEM

(76) Inventors: David J. Schanin, Denver, CO (US); Richard R. Billig, Los Gatos, CA (US)

(*) Notice: Subject to any disclaimer, the term of this patent is extended or adjusted under 35 U.S.C. 154(b) by 523 days.

(21) Appl. No.: 12/495,566

(22) Filed: Jun. 30, 2009

(65) Prior Publication Data

US 2010/0327778 A1 Dec. 30, 2010

(51) Int. Cl.
*H01H 37/00* (2006.01)

(52) U.S. Cl. .......................................... 307/117

(58) Field of Classification Search ................... 307/117
See application file for complete search history.

(56) References Cited

U.S. PATENT DOCUMENTS

| | | | |
|---|---|---|---|
| 528,904 A | | 2/1984 | Marshall et al. |
| 4,574,200 A | * | 3/1986 | Racca et al. ................ 307/117 |
| 523,925 A | | 8/1993 | Schanin et al. |
| 6,387,556 B1 | | 5/2002 | Fuglevand et al. |

* cited by examiner

*Primary Examiner* — Hal Kaplan

(57) ABSTRACT

A phase-controlled power delivery system for a load such as an incandescent lamp controls the rate of transition of an AC power waveform as a function of switch temperature or other heat-related parameter to provide for time-varying optimization of a tradeoff between heat and noise.

10 Claims, 2 Drawing Sheets

US 8,350,416 B2

TRANSITION-RATE CONTROL FOR PHASE-CONTROLLED AC POWER DELIVERY SYSTEM

BACKGROUND

Herein, related art is described for expository purposes. Related art labeled "prior art", if any, is admitted prior art; related art not labeled "prior art" is not admitted prior art.

Electrical power to an electrical load, in particular Alternating Current (AC) voltage, can be controlled by adjusting the time-averaged (e.g., RMS) voltage reaching the load. This is particularly applicable to incandescent lamp loads as modulating the RMS current supplied to lamps is not visible to the human eye due to the thermal mass of the lamp's filament. The RMS current can be modulated by controlling the peak-to-peak voltage of the AC voltage, e.g., varying a resistance inserted in series with the load, over which the supplied load voltage is dropped. However, the heat dissipated during the voltage drop can be excessive, nearly matching that of the load itself in the worst case.

An alternate method of controlling the RMS voltage supplied to a load is through the application of phase control to the AC voltage waveform. Phase control involves decoupling the load from the AC waveform for a portion of each AC half cycle so that the average voltage can be adjusted by adjusting the duty cycle during which the load is coupled to the AC waveform. In the case of phase control, relatively little heat is generated when the load is fully coupled or fully decoupled. However, many loads, such as incandescent lamps, are very sensitive to sharp transitions from a fully coupled to a fully decoupled state, as these rapid transitions tend to mechanically excite the lamp's filament and produce audible noise or "sing". Additionally, such sharp voltage transitions will tend to radiate electromagnetic waves causing interference with other electronic equipment in the vicinity. To minimize these effects, nearly all prior-art load controllers incorporate some form of transition controls. However, controlling such transitions requires a controlled impedance be placed between the load and the AC power source, and such a load impedance device will generate significant thermal load while controlling the transition. Thus, phase control of loads, and in particular lighting loads, involves design tradeoffs between heat and electrical and audible noise.

Because most electrical load controllers are obliged to deliver a requested RMS output voltage in response to a control input, and because varying the transition time in response to thermal conditions changes the relative contribution made by the transition time of the waveform to the full RMS output of the controller, the preferred embodiment for this type of load controller will incorporate an ability to sense the output voltage and adjust the phase of the switching means to regulate the effective output. (This would be referred to as closed-loop control of the output voltage.) While prior-art approaches provide for voltage regulation through the adjustment of the phase, based upon an analysis of the AC line input waveform, such an approach does not admit to each controlled channel using a different transition time in response to its own thermal environment. Hence a channel-by-channel RMS voltage closed loop control is preferred for this invention.

DETAILED DESCRIPTION

The present invention provides for regulating switch transition times as a function of switch temperature. When switch temperatures are sufficiently low, long transition times are used to avoid radiated electromagnetic noise and audible lamp noise. When switch temperatures are relatively high, the transition times are reduced to limit heat dissipation. In this way, a better tradeoff between heat and noise can be maintained automatically. This tradeoff can be done manually, but a more efficient method uses a microprocessor-based controller that monitors the temperature of the switches and modifies the transition time accordingly.

Figure 1:
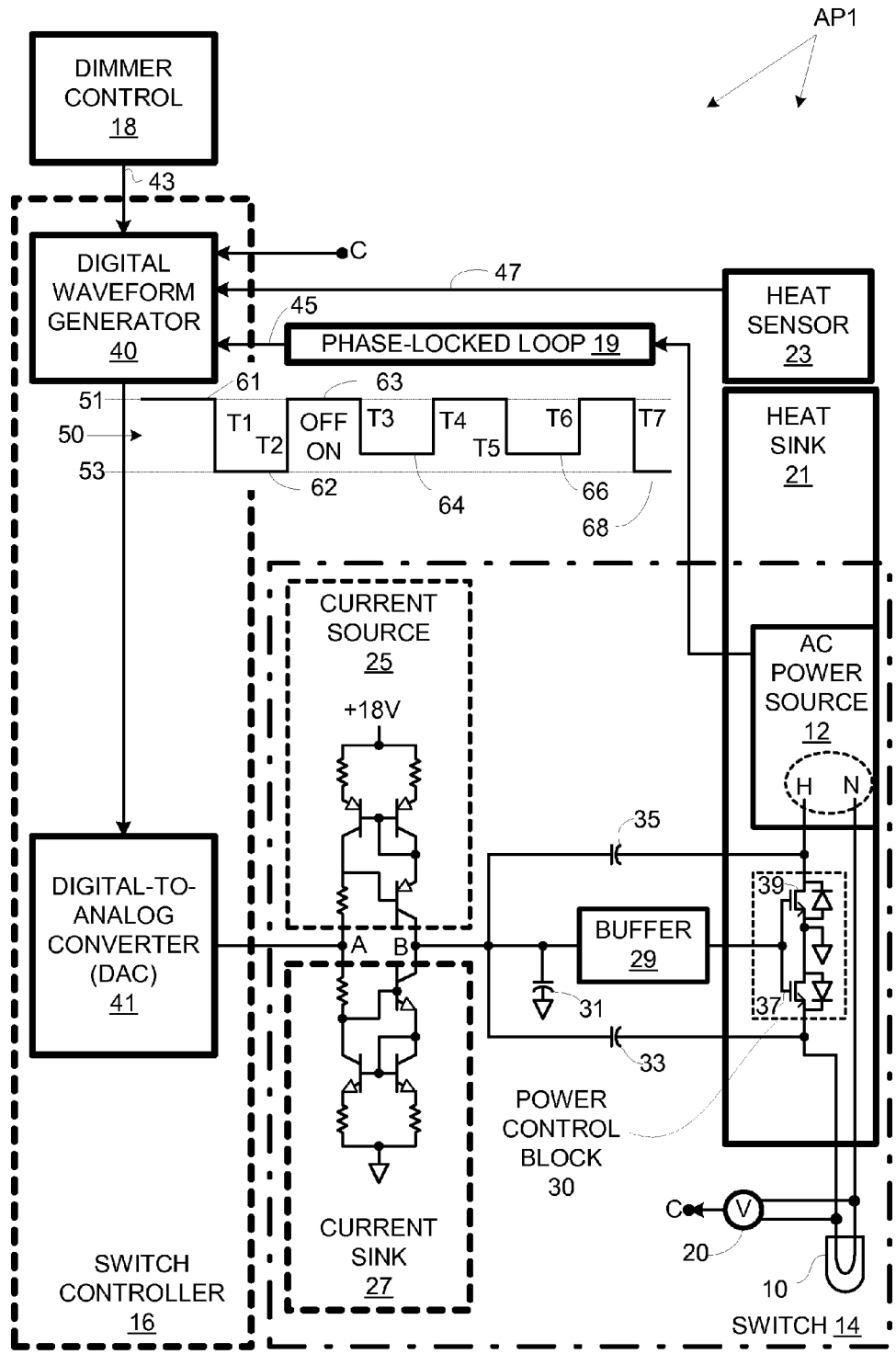
FIG. 1 is a combined schematic diagram of a lighting system in accordance with an embodiment of the invention.

A system AP1 for providing electrical AC power to a load, in this case a lamp 10, is shown in FIG. 1. System AP1 includes an AC power source 12, a switch 14, a switch controller 16, a dimmer control 18, and a phase-locked loop 19. Adjusting dimmer control 18 changes the target load voltage as measured by RMS voltage sensor 20. This signal is fed back to switch controller 16 which responds by adjusting, as necessary to achieve the set voltage, the phase of transitions between coupling and decoupling switch states of switch 14 and the output of phase locked loop 19. This in turn, adjusts the time-averaged voltage delivered to a load such as lamp 10, which thereby increases or decreases light output.

System AP1 further comprises a heat sink 21 and a heat sensor 23. Heat sink 21 is used for drawing heat away from power control block 30, while heat sensor 23 is disposed to measure the heat sink temperature as an indication of power block temperature. Switch controller 16 responds to measurements from heat sensor 23 by adjusting switch transition times, e.g., to lengthen transition times to reduce noise and to shorten transition times to reduce heat dissipation to maintain an effective tradeoff between noise and heat.

Switch 14 includes a current source 25, a current sink 27, a buffer (emitter-follower) 29, a power control block 30, and capacitors 31, 33, and 35. Power control block 30 includes inverse series IGFETs 37 and 39, which are the sources of heat in system AP1. These IGFETs 37 and 39 are mounted on heat sink 21 so that heat generated by the IGFETs can be conducted and radiated away.

Switch controller 16 includes a digital waveform generator 40 and a digital-to-analog converter (DAC) 41. Waveform generator 40 is responsive to control signals 43 from dimmer control 18, synchronization signals 45 from phase-locked loop 19, and sensor signals 47 from heat sensor 23. Phase-locked loop 19 derives 120 Hz synchronization signals 45 from 60 Hz AC power source 12.

Waveform generator 40 outputs a series of numerical values that are converted by DAC 41 into a switch control signal 50, which varies between a peak voltage 51 and a minimum voltage 53. Switch control signal 50 can be characterized as a square wave with a variable duty cycle and a variable transition depth. Varying the duty cycle changes the phase at which switch transitions occur and thus the brightness of lamp 10. Varying the trough depth changes the transition speed, and thus the heat generated by power block 30.

As shown in FIG. 1, switch control signal 50 includes peaks 61, 63, troughs 62, 64, 66, and 68, and transitions T1-T7. Signal 50 begins at a peak 61 and undergoes a maximum transition T1 to a trough 62. This transition T1 corresponds to a switch from off to on at an AC power waveform phase corresponding to the control signal phase as is called for when using forward phase control. The upward transition T2 from trough 62 to 63 corresponds to a zero crossing transition. The transition T3 from peak 63 to trough 64 is not a maximal transition since trough 64 is offset from minimum 53.

When signal 50 is at a maximum voltage 51, node A between current source 25 and current sink 27 is high, turning current source 25 fully off and current sink fully on. This pulls node B low, shutting off power control block 30 so that AC power is withheld from lamp 10. When signal 50 is at minimum voltage 53, current source 25 is on and current sink 27 is off. In this condition, power block 30 allows AC power source 12 to power lamp 10.

The transitions at node B are slower than the transitions at node A due, in part, to the action of capacitors 31, 33, and 35. Capacitor 31 is charged with constant current when waveform 50 is in a trough, and will therefore charge linearly to near +18V. When the input voltage to IGFETs 37 and 39 reaches their active region, the voltage level at which the IGFETs transition from non-conducting to conducting, capacitors 33 and 35 couple back the dv/dt occurring at the collectors of the IGFETs to slow the transition through the active region, and hence creating a slow IGFET transition between states.

However, in the case of transition T3, where trough 64 is offset above minimum 53, the transition at node B is further lengthened since current sink 27 is not fully on. This longer transition reduces noise but generates more heat. If heat buildup, as measured by heat sensor 23, becomes excessive, signal can return to maximal transitions, e.g., transition T7, to shorten voltage waveform transitions and reduce heat dissipation at the possible expense of increased noise.

Note that while FIG. 1 shows discrete transition depths, the depths can be continuously variable. Indeed, making the transitions continuously variable is desirable, because changes between discrete transitions make cause distinct audible noise, whereas a continuous transition, or a discrete transition through many steps, will be more likely to be imperceptible to the user.

System AP1 can provide for both forward phase control, as discussed above, and reverse phase control. In the latter case, it is the phases of the upward control signal transitions that are varied to control the power delivered to the load, and it is the control signal waveform peaks that are varied instead of the troughs.

Figure 2:
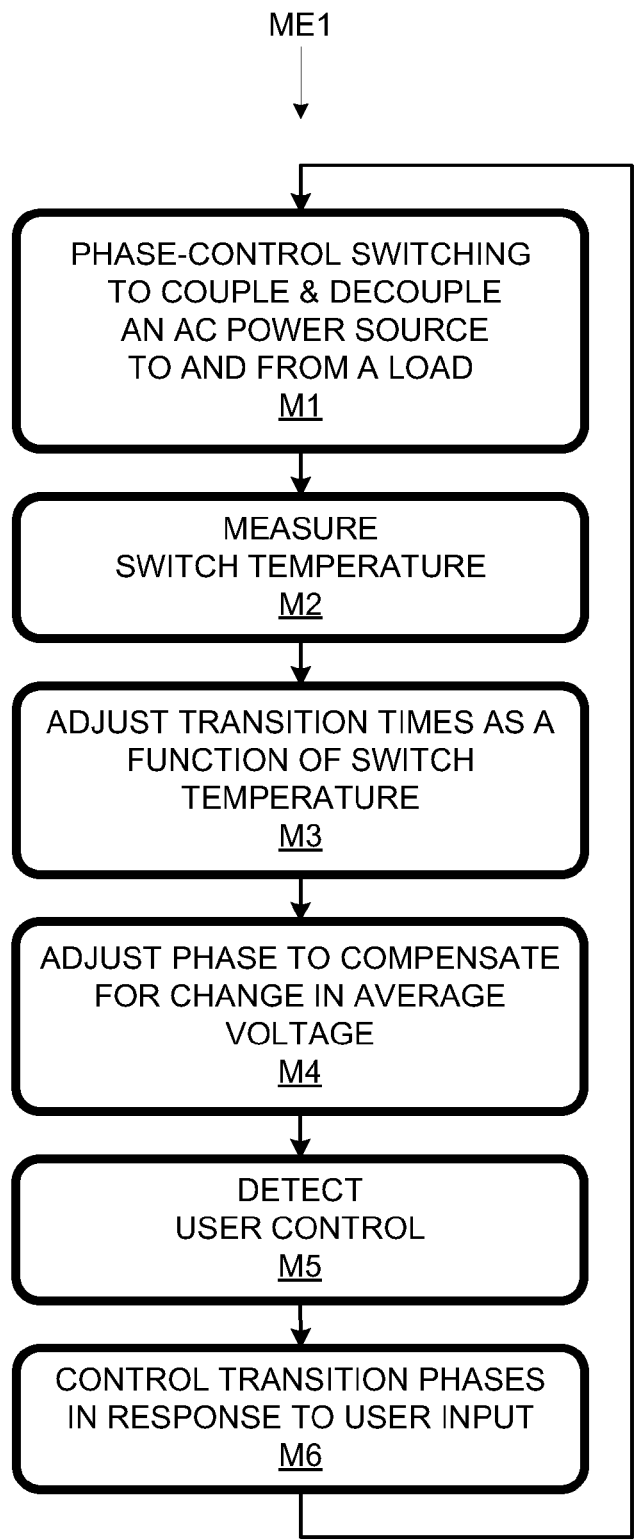
FIG. 2 is a flow chart of a method practiced in the context of the system of FIG. 1.

A method ME1, flow charted in FIG. 2, can be implemented in the context of system AP1. At ongoing method segment M1, phase-controlled switching couples and decouples a load from an AC power source. The RMS power to the load is determined by the phases of the transitions.

At ongoing method segment M2, the switch temperature is measured. Alternatively, another heat-related parameter, e.g., current through the switch and transition time, can be measured.

At ongoing method segment M3, switch transition times are adjusted as a function of the measured parameter to better optimize a tradeoff between heat and noise. Transitions can be minimized to minimize heat generation; transitions can be lengthened to reduce noise when heat is not a problem. If the transition time is changed by changing the transition end time without changing the transition start time, the voltage across the load will change. The feedback loop including RMS voltage sensor 20 adjusts the transition phase to compensate for the change due to the change in transition time. In an alternative open-loop embodiment, the waveform generator compensates for a computed expected impact on load voltage by adjusting the transition start time as well as its length.

Phase may be adjusted at M4 to compensate for a change in average voltage. At any time, a user may adjust a dimmer control. This adjustment can be detected at method segment M5. In response, the switch controller can adjust the phase of the transitions to control voltage delivery to the load at method segment M6. Method ME1 is continuous iterated as indicated by the return arrow to method segment M1.

In the illustrated embodiment, the IGFETs of the power control block are controlled synchronously; in other embodiments they are controlled anti-synchronously or independently. The present invention provides for better optimization in the tradeoff between heat and noise generation by an AC power delivery system. Other features and advantages are provided in addition to or in lieu of the foregoing by other embodiments within the scope of the following claims.

What is claimed is:

1. A system comprising a switch controller that outputs an analog signal to control both transition start times and transition times of a switch, said switch controller controlling said transition times at least in part as a function of a temperature of said switch, said switch controller having a heat input for receiving measurements of a heat-related parameter and a control output coupled directly or indirectly to said switch, said switch controller controlling said transition phases to compensate for changes in load voltage caused by changing said transition times.

2. A system as recited in claim 1 wherein said switch controller includes a user input so that said control output controls said transition start times as a function of user control signals received at said user input.

3. A system as recited in claim 1 further comprising:
an AC power supply for supplying AC power;
a switch arranged to cause transitions between a state in which said AC power is provided to a load and a state in which said AC power is withheld from said load, at least some of said transitions being characterized by transition said transition start times and said transition times, said transition start times corresponding to phases of said AC power; and
one or more sensors for measuring a heat-related parameter corresponding to heat generated by said switch, said one or more sensors being coupled to said switch controller.

4. A system as recited in claim 3 wherein said switch controller reduces said transition times in response to measurements of said heat-related parameter corresponding to relatively high heat and increases said transition times in response to measurements of said heat-related parameter corresponding to relatively low heat.

5. A system as recited in claim 3 further comprising a voltage sensor for providing a sensor voltage output corresponding to the RMS voltage across said load to said switch controller, said switch controller providing for adjusting said phases at least in part as a function of said sensor voltage output.

6. A method comprising:
switching a switch so as to cause transitions between a state in which a power supply is coupled to a load and a state in which said power supply is decoupled from said load;
measuring a heat-related parameter corresponding to the temperature of said switch to yield heat measurements;
controlling using a single analog signal to control both transition start times and transition times of said transitions as a function of said heat measurements; and
adjusting transition phases at which said transitions occur to compensate for changes in RMS voltage delivered to a load due to changes in said transition times.

7. A method as recited in claim 6 wherein said controlling involves decreasing a transition time in response to one or more measurements corresponding to a relatively high switch temperature and increasing a transition time in response to one or more measurements corresponding to a relatively low switch temperature.

8. A method as recited in claim 6 further comprising controlling transition start times at which said transitions begin at least in part as a function of a user input.

9. A method as recited in claim 6 wherein said adjusting is the result of closed loop regulation of load voltage.

10. A method as recited in claim 6 wherein said adjusting is based on a computed impact on load voltage due to a change in transition time.

\* \* \* \* \*